United States Patent
Leng et al.

(10) Patent No.: US 12,451,424 B2
(45) Date of Patent: Oct. 21, 2025

(54) INTEGRATED INDUCTOR WITH A STACKED METAL WIRE

(71) Applicant: Microchip Technology Incorporated, Chandler, AZ (US)

(72) Inventors: Yaojian Leng, Portland, OR (US); Justin Sato, West Linn, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 241 days.

(21) Appl. No.: 18/140,198

(22) Filed: Apr. 27, 2023

(65) Prior Publication Data

US 2023/0268269 A1    Aug. 24, 2023

Related U.S. Application Data

(62) Division of application No. 17/117,288, filed on Dec. 10, 2020, now Pat. No. 11,670,583.

(Continued)

(51) Int. Cl.
*H01L 23/522* (2006.01)
*H01F 27/28* (2006.01)
(Continued)

(52) U.S. Cl.
CPC ..... *H01L 23/5227* (2013.01); *H01F 27/2823* (2013.01); *H01F 27/32* (2013.01);
(Continued)

(58) Field of Classification Search
CPC .......... H01L 23/5227; H01L 23/53223; H01L 23/53238; H01L 23/645; H01L 28/10;
(Continued)

(56) References Cited

U.S. PATENT DOCUMENTS

| 11,094,628 B2 | 8/2021 | Leng |
| 2005/0104157 A1 | 5/2005 | Coolbaugh et al. .......... 257/531 |

(Continued)

FOREIGN PATENT DOCUMENTS

| CN | 103579096 A | 2/2014 | .......... H01L 21/768 |
| CN | 102569032 B | 5/2014 | ............. H01L 21/02 |

(Continued)

OTHER PUBLICATIONS

International Search Report and Written Opinion, Application No. PCT/US2021/016282, 12 pages, May 31, 2021.

(Continued)

*Primary Examiner* — Zandra V Smith
*Assistant Examiner* — John M Parker
(74) *Attorney, Agent, or Firm* — SLAYDEN GRUBERT BEARD PLLC

(57) ABSTRACT

A low-resistance thick-wire integrated inductor may be formed in an integrated circuit (IC) device. The integrated inductor may include an elongated inductor wire defined by a metal layer stack including an upper metal layer, middle metal layer, and lower metal layer. The lower metal layer may be formed in a top copper interconnect layer, the upper metal layer may be formed in an aluminum bond pad layer, and the middle metal layer may comprise a copper tub region formed between the aluminum upper layer and copper lower layer. The wide copper region defining the middle layer of the metal layer stack may be formed concurrently with copper vias of interconnect structures in the IC device, e.g., by filling respective openings using copper electrochemical plating or other bottom-up fill process. The elongated inductor wire may be shaped in a spiral or other symmetrical or non-symmetrical shape.

20 Claims, 13 Drawing Sheets

Related U.S. Application Data

(60) Provisional application No. 63/034,547, filed on Jun. 4, 2020.

(51) Int. Cl.
  *H01F 27/32* (2006.01)
  *H01L 23/532* (2006.01)
  *H10D 1/20* (2025.01)

(52) U.S. Cl.
  CPC .. *H01L 23/53223* (2013.01); *H01L 23/53238* (2013.01); *H01L 23/5329* (2013.01); *H10D 1/20* (2025.01)

(58) Field of Classification Search
  CPC ....... H01L 2924/19042; H10F 27/2823; H10F 27/32; H10F 27/2828; H10D 1/20
  See application file for complete search history.

(56) References Cited

U.S. PATENT DOCUMENTS

| | | | |
|---|---|---|---|
| 2009/0261937 A1 | 10/2009 | Ko et al. | 336/200 |
| 2009/0322447 A1 | 12/2009 | Daley et al. | 333/185 |
| 2013/0175073 A1 | 7/2013 | Cooney, III et al. | 174/257 |
| 2014/0042612 A1 | 2/2014 | Liu et al. | 257/734 |
| 2014/0354392 A1 | 12/2014 | Cooney, III et al. | 336/200 |
| 2017/0149404 A1 | 5/2017 | Tsai et al. | 257/531 |
| 2019/0122931 A1 | 4/2019 | Huang et al. | |
| 2020/0066634 A1* | 2/2020 | Do | H01L 21/4857 |
| 2020/0105459 A1 | 4/2020 | Yen et al. | |
| 2020/0177151 A1* | 6/2020 | Pierce | H01F 41/041 |
| 2020/0303109 A1 | 9/2020 | Cheng et al. | |
| 2020/0357767 A1 | 11/2020 | Sato et al. | |
| 2020/0411445 A1 | 12/2020 | Chen et al. | |
| 2021/0066192 A1 | 3/2021 | Chen et al. | |

FOREIGN PATENT DOCUMENTS

| | | | |
|---|---|---|---|
| WO | 2019/059898 A1 | 3/2019 | H01F 27/02 |
| WO | 2019/196354 A1 | 10/2019 | H01L 23/522 |

OTHER PUBLICATIONS

German Office Action, Application No. 112021003117.1, 10 pages, Sep. 18, 2023.
Chinese Office Action, Application No. 202180008411.3, 20 pages, Jun. 18, 2025.
Chinese Office Action, Application No. 202180008411.3, 24 pages, Aug. 20, 2025.

\* cited by examiner

INTEGRATED INDUCTOR WITH A STACKED METAL WIRE

RELATED APPLICATIONS

This application is a divisional of U.S. application Ser. No. 17/117,288 filed on Dec. 10, 2020, which claims priority to commonly owned U.S. Provisional Patent Application No. 63/034,547 filed Jun. 4, 2020, the entire contents of which applications are hereby incorporated by reference for all purposes.

TECHNICAL FIELD

The present disclosure relates to integrated circuit (IC) devices, and more particularly to a low-resistance integrated inductor formed with a stacked metal wire, for example a three-layer metal stack.

BACKGROUND

In the integrated circuit (IC) industry, the concept of Moore's law has largely shifted from pure-Si process integration to die-assembly and heterogeneous die integration (i.e., a shift from cost-per-transistor to cost-per-packaged transistor), for example to provide total-system-solutions (TSS) in a single package, such as system-on-chip (SoC) and system-in-package (SiP) solutions. For example, a heterogeneous multi-die SiP package may include multiple different types of dies mounted in a common package, along with various electrical components integrated in the package.

IC packages include various types of electronic devices, including transistors formed in a semiconductor substrate, and additional components such as capacitors, resistors, and inductors. An inductor formed in an IC package is referred to as an "integrated circuit inductor" or simply an "integrated inductor." Integrated inductors have a wide range of applications. For example, integrated inductors are beneficial in radio frequency (RF) and mm-wave circuits (e.g., in mobile devices) in which high frequency operation requires small inductance, as compared with external inductors (e.g., inductors mounted to a printed circuit board (PCB)) that are often overwhelmed by parasitic effects. Integrated inductors are also particularly suitable for low-noise amplifiers (LNAs), resonant load and matching network applications, and RF filters. As another example, integrated inductors are very useful for constructing a power supply on a chip (PowerSoC), for example in a power management device (e.g., DC-DC converter). Such integrated inductors may be used in integrated voltage regulators (IVRs) and switch mode power supplied (SMPSs), such as buck-boost converters, for example.

However, although integrated inductors are useful in many different applications, they are typically difficult to manufacture, e.g., as compared with integrated resistors or capacitors in an SoC or SiP product.

Conventional integrated inductors are typically constructed with thick wires (typically formed from aluminum (Al) or copper (Cu)) using customized processes, and are therefore relatively expensive. The thick wire inductor provides performance benefits. In particular, increased wire thickness reduces resistance, which improves the quality factor (Q) of the integrated inductor. The quality factor Q may be represented by Equation 1:

$$Q = \omega * L/R \qquad (1)$$

where ω represents angular frequency, L represents inductance, and R represents series resistance. According to Equation 1, reducing the resistance increases the inductor quality factor Q. Most conventional integrated inductors are manufactured with a dedicated extra thick metal layer. For example, some conventional designs incorporate an inductor module including a dedicated 4 μm inductor metal. Other conventional designs use two dedicated aluminum metal layers to create integrated inductors, which are formed with two layers of 2 μm aluminum wire using a very lengthy (and thus expensive) deposition, chemical mechanical planarization (CMP), and metal etch process.

Other conventional integrated inductors are formed using less expensive processes, but provide poor inductor performance. For example, multi-layer inductors may be formed with different metal layers, connected through via connections, without any additional process steps. These multi-layer inductors generally provide a low quality factor Q, as they typically experience high wire resistance, e.g., due to the via connections, are formed close to the package substrate (resulting in increased substrate loss), and have a low self-resonant frequency resulting from increased line-to-line coupling capacitance.

FIGS. 1 and 2 show three-dimensional top views of two example spiral inductors 100 and 200 formed according to conventional techniques. FIG. 1 shows an example non-symmetrical inductor 100, while FIG. 2 shows an example symmetrical inductor 200. A symmetrical inductor typically outperforms a non-symmetrical inductor because a symmetrical inductor, unlike a non-symmetrical inductor, can be formed with the geometric center coinciding with the magnetic and electric center of the inductor, which increases the mutual inductance and thus the total inductance.

Turning first to FIG. 1, the example non-symmetrical inductor 100 is formed in two metal layers, with a main portion of the inductor wire, indicated at 102, formed in a Metal 2 layer, and a connection portion of the inductor wire, indicated at 104, formed in an underlying Metal 1 layer, wherein the connection portion 104 (Metal 1) is connected to the main portion 102 (Metal 2) by vertically-extending metal vias 106, e.g., tungsten (W) vias. The main portion 102 of the inductor wire crosses over, or overlaps, the connection portion 104 at multiple crossover locations, indicated at 110. At each crossover location 110, the main portion 102 is physically separated and conductively insulated from the underlying connection portion 104 by a passivation layer.

Like the non-symmetrical inductor 100 shown in FIG. 1, the symmetrical inductor 200 shown in FIG. 2 is also formed in two metal layers, with a main portion of the inductor wire, indicated at 202, formed in a Metal 2 layer, and connection portions of the inductor wire, indicated at 204, formed in an underlying Metal 1 layer, wherein each connection portion 204 (Metal 1) is connected to the main portion 202 (Metal 2) by vertically-extending metal vias 206, e.g., tungsten (W) vias. The main portion 202 of the inductor wire crosses over, or overlaps, the connection portion 204 at multiple crossover locations, indicated at 210. At each crossover location 210, the main portion 202 is physically separated and conductively insulated from the underlying connection portion 204 by a passivation layer.

As discussed above, in the example spiral inductors 100 and 200 shown in FIGS. 1 and 2, the main portion 102, 202 of the inductor wire may be formed in a Metal 2 layer, and the connection portion(s) 104, 204 may be formed in an underlying Metal 1 layer. In some implementations, the Metal 1 layer may comprise copper (Cu), and the Metal 2 layer may comprise aluminum (Al).

There is a need for high-performance integrated inductors having lower wire resistance than integrated inductor designs, e.g., the example designs discussed above, and at low cost as compared with conventional low-resistance inductors.

SUMMARY OF THE INVENTION

Embodiments of the present invention provide integrated circuit (IC) packages, e.g., system-on-chip (SoC) or system-in-package (SiP), including an integrated inductor having a thick inductor wire, e.g., formed by a stack of multiple metal layers (e.g., three metal layers). The thick-wire integrated inductor may have a low resistance and may be formed at low cost, e.g., by adding few or no additional steps to the background IC device fabrication process. For example, some embodiments provide a thick-wire integrated inductor having a resistance of less than 5 mΩ/sq, less than less than 4 mΩ/sq, or less than 3 mΩ/sq, depending on the particular configuration.

In some embodiments, the integrated inductor may include an elongated inductor wire defined by a metal layer stack including an upper metal layer, a middle metal layer, and a lower metal layer. The lower metal layer may be formed in a top copper interconnect layer, the upper metal layer may be formed in an aluminum bond pad layer, and the middle metal layer may comprise a wide copper region formed between the aluminum upper layer and copper lower layer. The wide copper region defining the middle layer of the metal layer stack may be formed concurrently with copper vias of other electronic components in the IC device, e.g., by filling respective openings using copper electrochemical plating or other bottom-up fill process. The elongated inductor wire may be shaped in a spiral or other symmetrical or non-symmetrical shape.

Integrated inductors according to the present invention may be formed in a die mounted on a package substrate or other mounting structure (e.g., an interposer), or may be formed in the package substrate or mounting structure (e.g., interposer) itself.

One aspect of the invention provides an integrated circuit (IC) device including an integrated inductor, wherein the integrated inductor comprises an elongated inductor wire defined by a triple stack of metal layers including a upper metal layer, a middle metal layer, and a lower metal layer, wherein the middle metal layer has a lateral width greater than 1 μm.

In some embodiments, the upper metal layer of the inductor wire comprises aluminum, the middle metal layer of the inductor wire comprises copper, and the lower metal layer of the inductor wire comprises copper. In one embodiment, the copper lower layer of the inductor wire comprises a top copper interconnect layer. In one embodiment, the upper metal layer of the inductor wire comprises a region of an aluminum bond pad layer.

In one embodiment, the middle metal layer of the inductor wire is formed in a common layer with metal vias distinct from the integrated inductor, and a lateral width or diameter of each metal via is less than 1 μm. In one embodiment, the middle metal layer of the inductor wire has a lateral width greater than 2 μm, and a lateral width or diameter of each metal via is less than 0.5 μm.

In one embodiment, a lateral width of each of the upper metal layer, middle metal layer, and lower metal layer of the inductor wire is greater than 1 μm.

In some embodiments, the integrated inductor has a resistance of less than 5 mΩ/sq, less than less than 4 mΩ/sq, or less than 3 mΩ/sq.

In some embodiments, the integrated inductor comprises a spiral inductor. In one embodiment, the spiral inductor includes (a) a triple-stacked wire region defined by the triple stack of metal layers including the upper metal layer, the middle metal layer, and the lower metal layer, and (b) at least one overlap region in which the inductor wire includes the upper metal layer and the lower metal layer, but omits the middle metal layer, such that in the overlap region the upper metal layer is separated from the lower metal layer by non-conductive material.

In one embodiment, the IC structure comprises a die mount base configured for mounting at least one die. In another embodiment, the IC structure comprises an interposer.

Another aspect of the invention provides an IC device including an integrated inductor having an elongated inductor wire defined by a metal layer stack including (a) an upper metal layer having a upper metal lateral width, (b) a middle metal layer having a middle metal lateral width, and (c) a lower metal layer having a lower metal lateral width. A largest width of the upper metal lateral width, middle metal lateral width, and lower metal lateral width varies from a smallest width of the upper metal lateral width, middle metal lateral width, and lower metal lateral width by less 100%, less than 50%, less than 25%, or less than 10%, depending on the particular embodiment.

Another aspect of the invention provides a method of forming an integrated inductor in an integrated circuit (IC) device. The method may include forming a lower metal layer of the integrated inductor, forming an insulating region over the lower metal layer of the integrated inductor, etching a tub opening having a lateral width greater than 1 μm in the insulating region, depositing metal in the tub opening to define a middle metal layer of the integrated inductor on the lower metal layer of the integrated inductor, and forming a upper metal layer of the integrated inductor on the middle metal layer of the integrated inductor.

In one embodiment, the lower metal layer comprises copper, the middle metal layer comprises copper, and the upper metal layer of comprises aluminum.

In one embodiment, forming the lower metal layer comprises forming a top copper interconnect layer, forming the insulating region over the lower metal layer comprises forming a passivation region, and forming the upper metal layer comprises forming an aluminum bond pad layer.

In one embodiment, etching the tub opening in the insulating region comprises etching the tub opening concurrently with etching at least one via opening each having a lateral width less than 1 μm.

In one embodiment, depositing metal in the tub opening to define the middle metal layer comprises depositing copper in the tub opening concurrently with depositing copper in at least one via opening separate from the integrated inductor.

In one embodiment, depositing metal in the tub opening to define the middle metal layer comprises performing a copper electrochemical plating.

BRIEF DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention provide integrated inductors having a thick inductor wire, for example formed from a triple stack of metal layers in an IC device, to provide reduced resistance in the inductor wire. Integrated inductors according to embodiments of the present disclosure are referred to as "thick-wire integrated inductors."

Other embodiments provide IC packages, for example system-on-chip (SoC) and system-in-package (SiP) packages including at least one thick-wire integrated inductor, wherein each thick-wire integrated inductor may be formed in a die mounted on a package substrate or other mounting structure (e.g., an interposer), or formed in the package substrate or mounting structure itself. Other embodiments provide methods for forming thick-wire integrated inductors, and IC packages including thick-wire integrated inductors.

Figure 1:
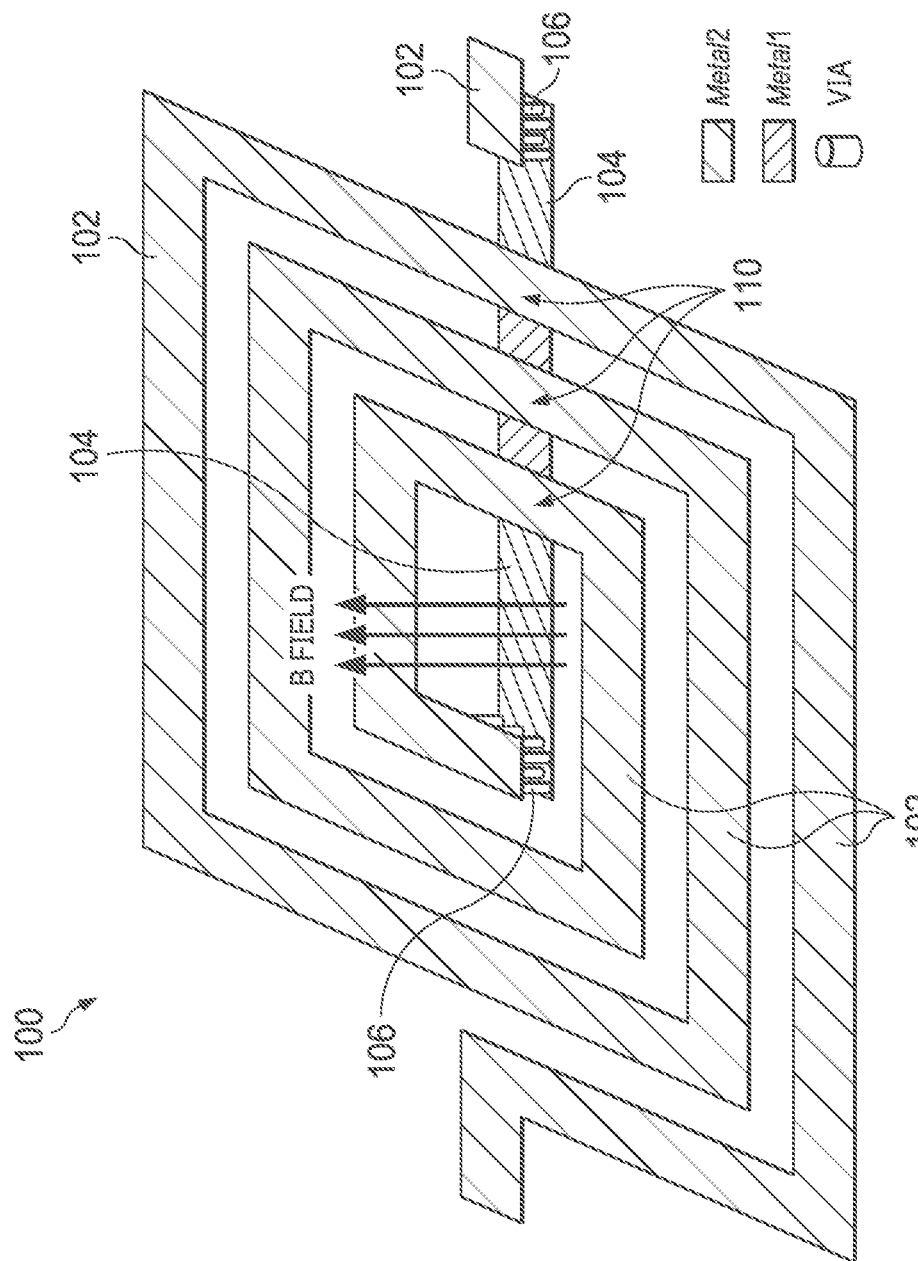
FIG. 1 shows a three-dimensional top view of an example non-symmetrical spiral inductor formed according to the prior art.
Figure 2:
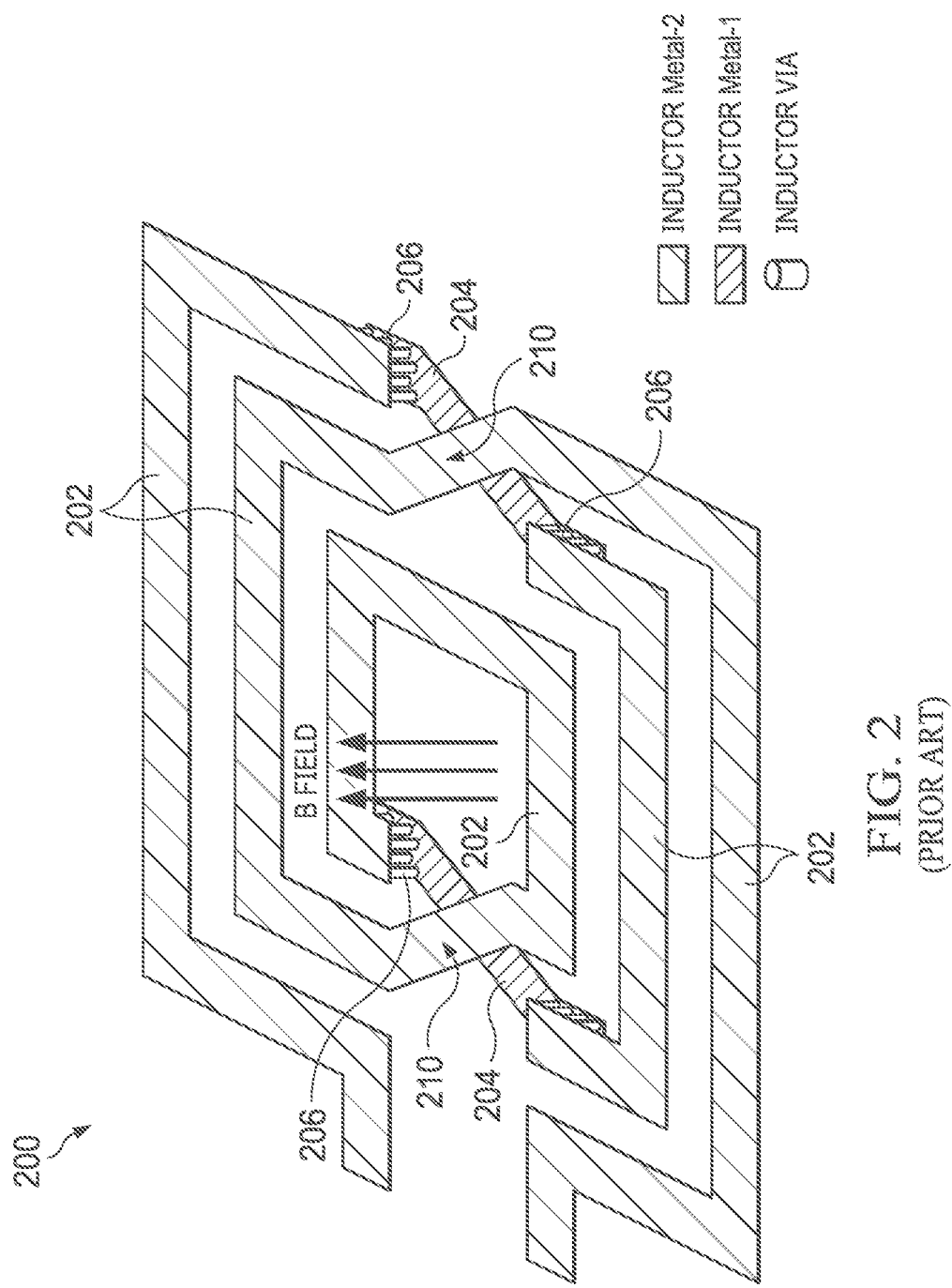
FIG. 2 shows a three-dimensional top view of an example symmetrical spiral inductor formed according to the prior art.
Figure 3:
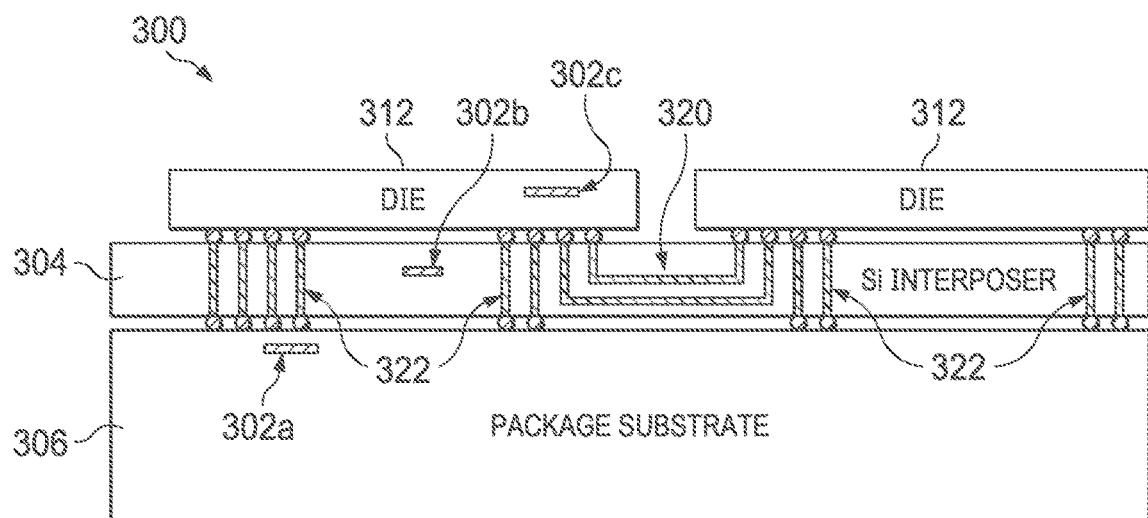
FIG. 3 shows a cross-sectional side view of an example multi-die IC package showing example locations of thick-wire integrated inductors, according to one example embodiment.
Figure 4:
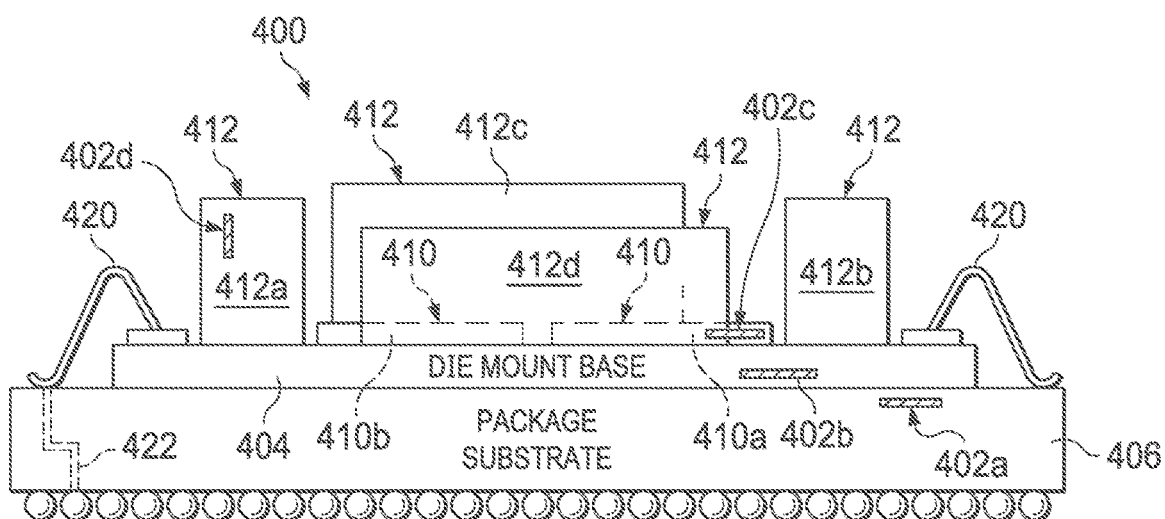
FIG. 4 shows a cross-sectional side view of an example mixed-orientation multi-die (MOMD) IC package showing example locations of thick-wire integrated inductors, according to one example embodiment.

FIGS. 3 and 4 illustrate two example IC packages 300 and 400 including at least one thick-wire integrated inductor, e.g., having a thick inductor wire formed from a triple stack of metal layers, according to example embodiments of the present invention. Each IC package 300, 400 may include at least one thick-wire integrated inductor formed in the package substrate or die mount structure (e.g., interposer), and/or in at least one die mounted on the package substrate or die mount structure (e.g., interposer). Thus, as discussed below, FIGS. 3 and 4 each illustrate various example locations of a thick-wire integrated inductor 302, 402 formed according to the present disclosure.

FIG. 3 shows a cross-sectional side view of an example multi-die IC package 300 including thick-wire integrated inductors 302a-302c, according to one example embodiment. IC package 300 includes multiple dies 312 mounted (e.g., solder mounted) on a silicon interposer 304, which is in turn mounted (e.g., solder mounted) on a package substrate 306. In one example embodiment, IC package 300 may be a field programmable gate array (FPGA) package including an FPGA die and memory die mounted to interposer 304, and/or any other dies or components of an FPGA package. In other embodiments, IC package 300 may be any other type of device including any number and type(s) of dies 312 mounted to interposer 304.

As shown, the silicon interposer 304 may include (a) interconnections 320 between the multiple dies 312 (and similar interconnections between any other dies mounted on the silicon interposer 304), and (b) through-silicon vias (TSVs) 322 extending vertically through the silicon interposer 304 to connect at least one die 312 to circuitry in the package substrate 306 (and in some implementations, to circuitry on an underlying PCB to which the IC package 300 is mounted through TSVs or other connections (not shown) extending vertically though the package substrate 306).

The example IC package 300 shown in FIG. 3 includes a first thick-wire integrated inductor 302a formed in the package substrate 306, a second thick-wire integrated inductor 302b formed in the silicon interposer 304, and a third thick-wire integrated inductor 302c formed in a die 312. However, it should be understood that the number and locations of thick-wire integrated inductors 302a-302c shown in FIG. 3 represents only one example embodiment. In other embodiments, IC package 300 may include any number (e.g., zero, one, or more than one) thick-wire integrated inductor formed in the package substrate 306, silicon interposer 304, and/or one or more dies 312.

FIG. 4 shows a cross-section of an example mixed-orientation multi-die ("MOMD") package 400 including thick-wire integrated inductors 402a-402d formed according to the present disclosure, according to one embodiment of the present invention. MOMD package 400 may correspond with any of the MOMD packages shown in FIGS. 3A-3B and 4 of co-pending U.S. patent application Ser. No. 16/540,117 filed Aug. 14, 2019, and published as US2020/0357767A1, the entire contents of which are hereby incorporated by reference. MOMD package 400 includes one or more horizontally-mounted dies (HMDs) 410 and one or more vertically-mounted dies (VMDs) 412 mounted on a horizontally-extending die mount base 404, which is in turn mounted on a package substrate 406.

The illustrated embodiment includes two HMDs 410a, 410b and four VMDs 412a, 412b, 412c, 412d. The combination of both VMDs and HMDs in the same package provides the "mixed-orientation" aspect of the mixed-orientation multi-die package.

The example MOMD package 400 shown in FIG. 4 includes a first thick-wire integrated inductor 402a formed in the package substrate 406, a second thick-wire integrated inductor 402b formed in the die mount base 404, a third thick-wire integrated inductor 402c formed in HMD 410a, and a fourth thick-wire integrated inductor 402d formed in VMD 412a. However, it should be understood that the number and locations of thick-wire integrated inductors 402a-402d shown in FIG. 4 represents only one example embodiment. In other embodiments, MOMD package 400 may include any number (e.g., zero, one, or more than one) thick-wire integrated inductor formed in each of the package substrate 406, die mount base 404, one or more HMD 410, and/or one or more VMD 412.

Thick-wire integrated inductor 402a-402c formed in package substrate 406, die mount base 404, and HMD 410a may be oriented horizontally, e.g., wherein each metal layer defining the thick wire of the respective integrated inductor (e.g., metal layers 512, 514, and 516 of the example integrated inductor 500 discussed below) extends in a respective horizontally extending plane. As a result, the B-field of each horizontally-oriented thick-wire integrated inductor 402a-402c extends vertically, i.e., perpendicular to the orientation of the integrated inductor. In contrast, as shown in FIG. 4, thick-wire integrated inductor 402d formed in VMD 410a may be oriented vertically, e.g., wherein each metal layer defining the thick wire of the respective integrated inductor extends in a respective vertically extending plane. As a result, the B-field of the vertically-orientated thick-wire integrated inductor 402d extends horizontally, i.e., perpendicular to the orientation of the integrated inductor 402d.

It should be understood that FIGS. 3 and 4 represent only two example types of IC packages in which thick-wire integrated inductors formed according to the present disclosure may be formed. Thick-wire integrated inductors formed according to the present disclosure may be formed in any other types of IC packages, and in any component of such packages, e.g., a package substrate, an interposer, a die mount base, or one or more dies.

Figure 5A:
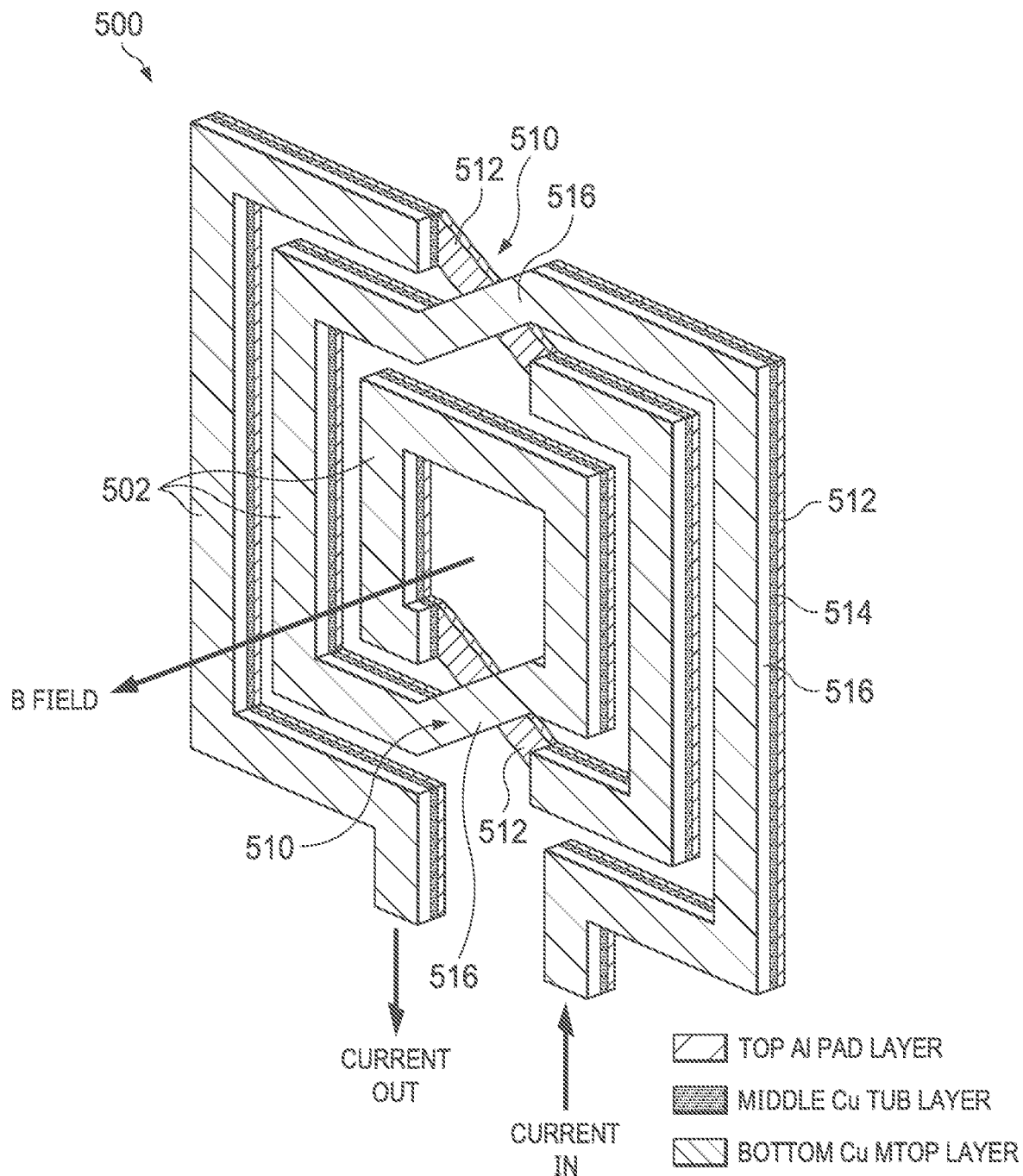
FIGS. 5A-5D illustrate various views of an example thick-wire integrated inductor, according to one embodiment of the invention.
Figure 5B:
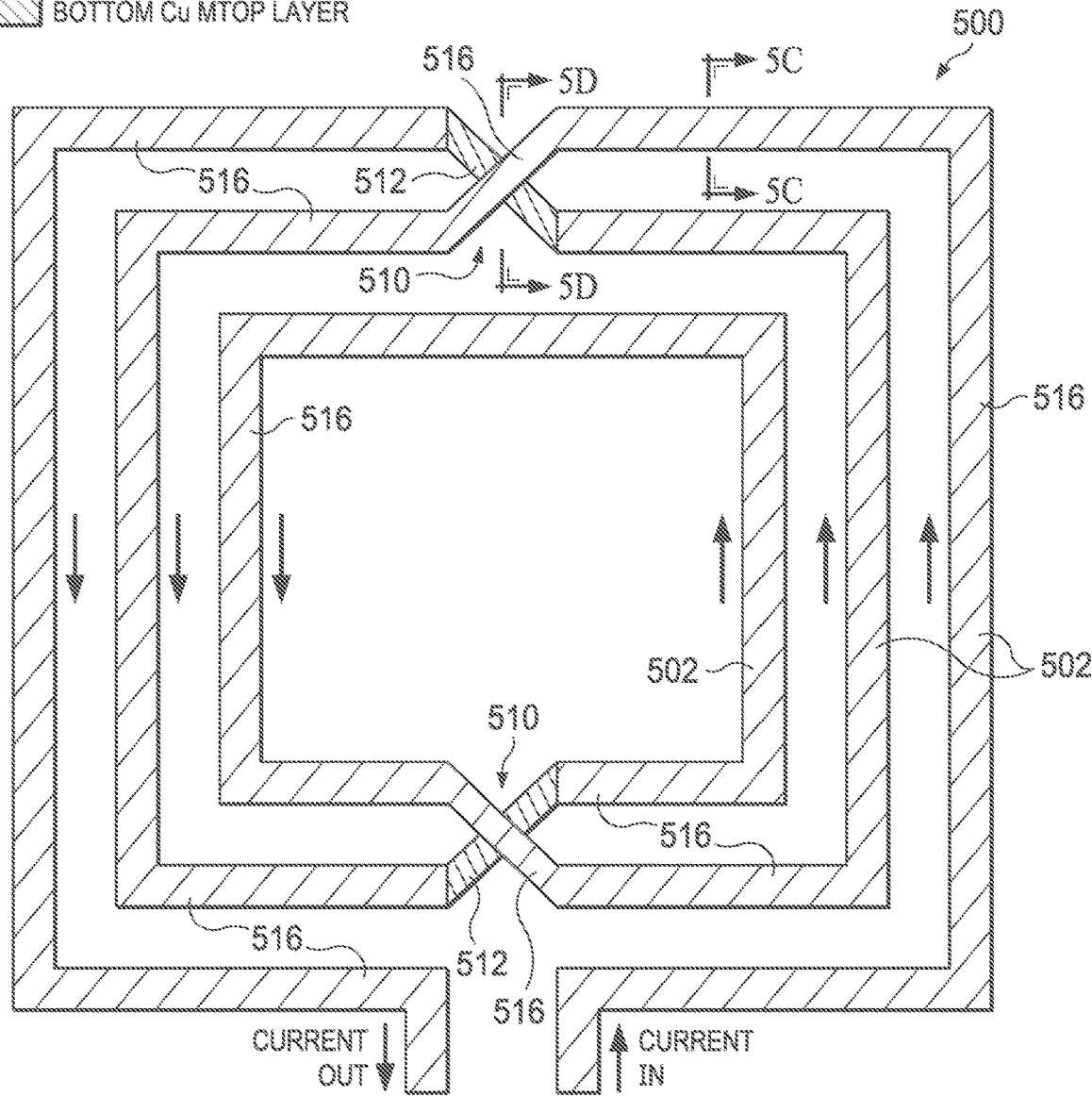

FIGS. 5A-5D illustrate an example thick-wire integrated inductor 500, according to one embodiment of the invention. FIGS. 5A and 5B show a three-dimensional top view and a direct top view, respectively, of the example thick-wire integrated inductor 500. As shown in FIGS. 5A and 5B, thick-wire integrated inductor 500 includes an inductor wire 502 formed with a symmetrical spiral shape. The inductor wire 502 is constructed of a metal layer stack including three metal layers, referred to as a "triple-stacked" wire, except in overlap regions indicated at 510, which constitutes a very small fraction of the overall length of inductor wire 502 (e.g., less than 5%, less than 1%, or less than 0.1% of the overall length of inductor wire 502, depending on the embodiment). At each overlap region 510, the middle metal layer is replaced by an electrically insulating layer, e.g., a passivation layer, to physically and electrically separate the upper metal layer from the lower metal layer and thereby prevent an electrical short at the respective overlap region 510.

Figure 5C:
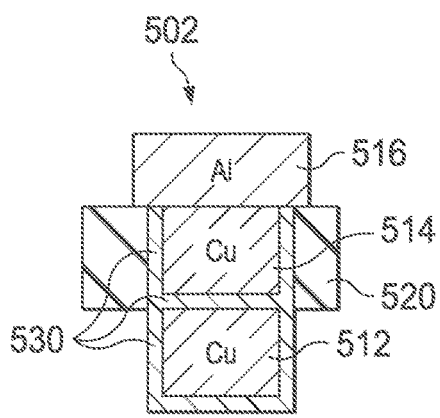
Figure 5D:
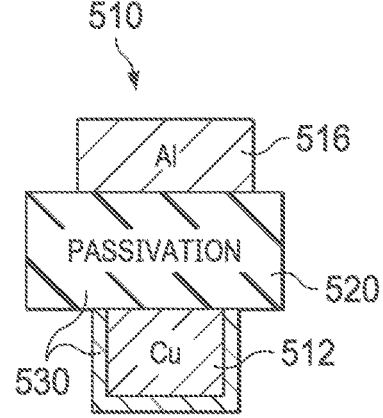

To illustrate the above, FIG. 5C shows a cross-sectional side view of the triple-stacked inductor wire 502 at cut line 5C-5C shown in FIG. 5B, and FIG. 5D shows a cross-sectional side view of an overlap region 510 at cut line 5D-5D shown in FIG. 5B. As shown in FIG. 5C, the triple-stacked inductor wire 502 may include a lower metal layer 512 (e.g., copper), a middle metal layer 514 (e.g., copper), and an upper metal layer 516 (e.g., aluminum). In some embodiments, each metal layer 512, 514, 516 may be covered on one, some, or all sides by a barrier layer 530, e.g., comprising Ta/TaN, Ti/TiN or other suitable material, which may be deposited prior to forming each respective metal layer 512, 514, 516.

As discussed in greater detail below, in some embodiments the thick-wire integrated inductor 500 may be constructed concurrently with the integrated circuit interconnect structures. For example, the triple-stacked inductor wire 502 may be constructed using the top metal interconnect layer and overlying bond pad layer of an IC device, by forming a conductive structure in the layer between the top interconnect layer and overlying bond pad layer to thereby define a triple-stacked metal wire. In IC structures using copper interconnects, the copper interconnects typically terminate at aluminum bond pads, to be fully compatible with legacy packaging. Thus, in some embodiments, the triple-stacked inductor wire 502 may be constructed using the top Cu interconnect layer (e.g., referred to as "Cu MTOP layer") and overlying aluminum bond pad layer, by forming a copper "tub" region between the Al bond pad layer and Cu MTOP layer to define the triple-stacked inductor wire 502. Thus, referring to FIG. 5C, in one embodiment the lower metal layer 512 is formed in a Cu MTOP layer, the middle metal layer 514 comprises an elongated copper tub formed in a passivation layer 520 (e.g., using a single damascene copper deposition process), and the upper metal layer 516 is formed in an aluminum bond pad layer.

Turning to FIG. 5D, the middle metal layer 514 (e.g., Cu tub region) of the triple-stacked wire 502 shown in FIG. 5C is not formed in the overlap region 510, such that the upper metal layer 516 (which defines a conductive overpass) is separated and electrically insulated from the lower metal layer 512 (which defines a conductive underpass) by the passivation layer 520, to thereby prevent an electrical short at the overlap region 510. In one embodiment, the passivation layer includes multiple dielectric layers, for example, deposited in the following order: (1) 0.1 µm Silicon Nitride, (2) 0.1 µm Silicon Rich Oxide (SRO), (3) 0.68 µm Phosphorus Silicate Glass (PSG), and (4) 0.58 µm Silicon oxynitride (SiON), however other combinations known to those skilled in the art may be utilized without exceeding the scope. This overlap configuration allows the formation of the symmetrical spiral inductor design shown in FIGS. 5A and 5B.

The thick-wire integrated inductor 500, defined by the triple-stacked wire 502 extending along the large majority of the inductor wire length with relatively short overlap regions 510, can provide an integrated inductor with very low metal resistance, which improves the quality factor Q of the inductor. For example, thick-wire integrated inductor 500 may have a resistance of less than 5 mΩ/sq, less than 4 mΩ/sq, or less than 3 mΩ/sq, e.g., in the range of 1-3 mΩ/sq. For example, the triple-stacked metal wire 502 may include (a) a 2 µm thick (vertically) Cu MTOP layer 512 (having a resistance of about 10 mΩ/sq), (b) a 2 µm thick (vertically) Cu tub layer 514 (having a resistance of about 10 mΩ/sq), and (c) a 4 µm thick (vertically) Al bond pad layer 516 (having a resistance of about 8 mΩ/sq), which provides a total resistance of about 3 mΩ/sq for the triple-stacked wire 502.

The example thick-wire integrated inductor 500 shown in FIGS. 5A-5D has a symmetrical spiral shape with three square turns. In other embodiments, the symmetrical spiral inductor may be formed with any other number of turns, e.g., two, four, five, six, or more turns. Further, in other embodiments, the similar symmetrical spiral inductor may be formed with hexagonal, octagonal, or circular shaped turns (with any number of such turns, e.g., two, three, four, five, six, or more turns), e.g., to further increase the area/perimeter ratio of the spiral shape and thereby lower the resistance (R) for a given inductance value (L).

As discussed above, in some embodiments, a thick-wire integrated inductor may be constructed simultaneous with the construction of the IC interconnect structures, for example using a top Cu interconnect layer (Cu MTOP layer) and overlying Al bond pad layer, by forming a Cu tub region between Al bond pad layer and Cu MTOP layer to define a triple-stacked inductor wire. In a conventional IC structure, Al bond pads are connected to underlying Cu interconnect elements by a tungsten (W) via. In embodiments of the present invention, the conventional tungsten via may be replaced by a single damascene copper via, such that IC structures that include via connections between the Al bond pad layer and Cu MTOP layer may be formed concurrently with a thick-wire integrated inductor. In particular, the Cu tub region (middle layer) of the thick-wire integrated inductor may be formed concurrently with Cu via (replacing the conventional tungsten via) of other IC structures in the device, e.g., according to the Cu deposition process shown in FIGS. 9A-9C discussed below.

Figure 6:
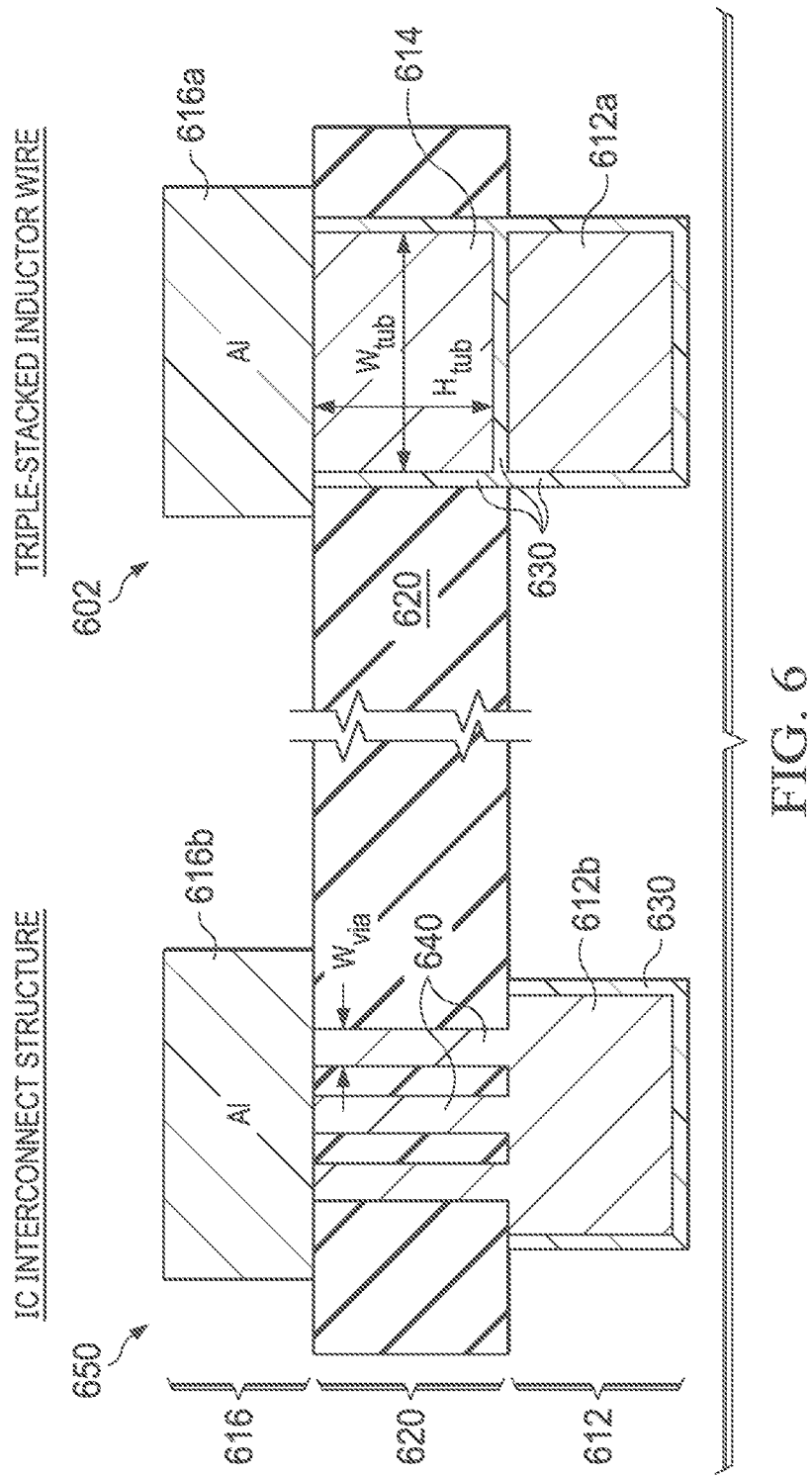
FIG. 6 illustrates an example triple-stacked inductor wire formed concurrently with a separate IC structure, according to one embodiment of the invention.

FIG. 6 illustrates an example triple-stacked inductor wire 602 formed concurrently with a separate IC interconnect structure 650 involving a Cu MTOP layer 612 and overlying Al bond pad layer 616. As shown, the triple-stacked inductor wire 602 includes a lower Cu layer 612a comprising a copper region formed in the Cu MTOP layer 612, a middle Cu layer 614 comprising a Cu tub region formed in a passivation layer 620, and an upper Al layer 616a comprising an aluminum region formed in the Al bond pad layer 616. In some embodiments, a barrier layer 630, e.g., comprising Ta/TaN, Ti/TiN or other suitable material, may be deposited prior to forming each of lower Cu layer 612a and middle Cu layer 614, to prevent or reduce copper diffusion.

The separate IC interconnect structure 650 includes a Cu interconnect element 612b formed in the Cu MTOP layer 612 and an Al bond pad 616b connected to the Cu interconnect element 612b by one or more copper via 640 through a portion of passivation layer 620. As discussed above, both the middle Cu layer 614 of the triple-stacked inductor wire 602 and the Cu vias 640 of the separate IC structure 650 may be formed concurrently, e.g., using a single damascene copper via process.

As used herein, a "via" refers to a conductive via formed by plugging or otherwise depositing a conductive material (e.g., copper) in a via opening (or "via hole") having a small diameter or lateral width $W_{via}$, for example a diameter or width below 1 μm, and thus having a relative large resistance. Thus, each Cu via 640 may have a diameter or lateral width $W_{via}$ below 1 μm. In contrast, Cu tub region 614 may be formed with a lateral width $W_{tub}$ in the range of 1-10 μm, and a vertical thickness, or height, $H_{tub}$ in the range of 1-10 μm. In some embodiments, the tub opening 614 may be formed with a height-to-width aspect ratio ($H_{tub}/W_{tub}$) of less than 2.0, e.g., to allow effective filling of the tub opening 614 by a copper fill, as discussed below. For example, the tub opening 614 may be formed with an aspect ratio $H_{tub}/W_{tub}$ in the range of 0.1-2.0, for example in the range of 0.5-2.0. In some embodiments, the tub opening 614 may be formed with an aspect ratio $H_{tub}/W_{tub}$ of less than 1.5, e.g., for effective filling of the tub opening 614 by a copper fill. For example, the tub opening 614 may be formed with an aspect ratio $H_{tub}/W_{tub}$ in the range of 0.5-1.5, or more particularly in the range of 0.8-1.2.

Figure 10A:
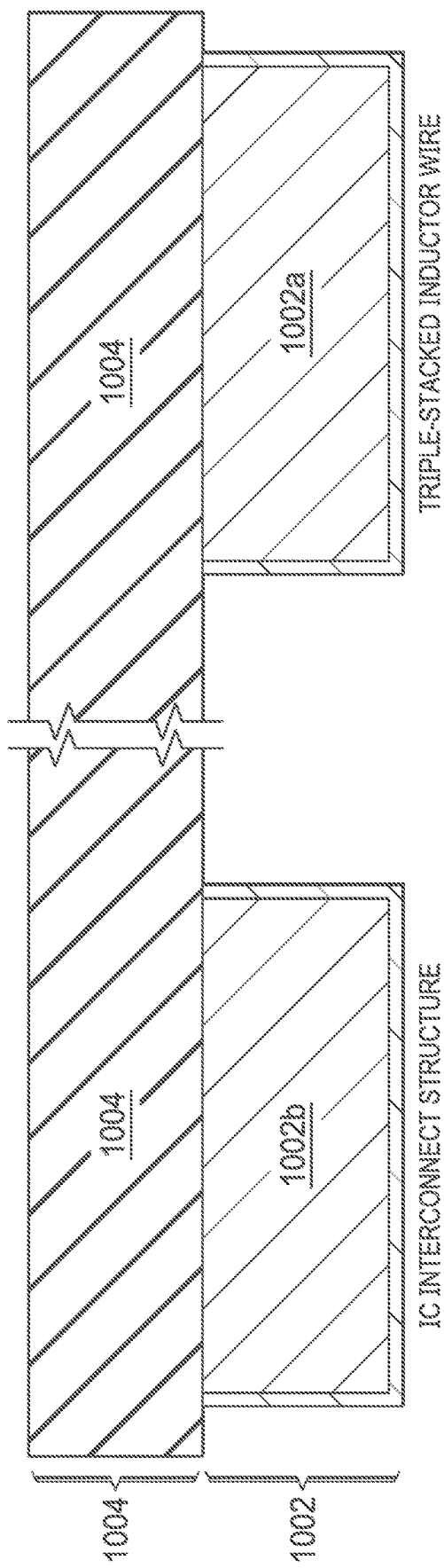
FIGS. 10A-10D illustrate an example process for forming an integrated inductor including a triple-stacked inductor wire during the construction of IC interconnect structures without any additional process steps, according to one embodiment of the invention.
Figure 10B:
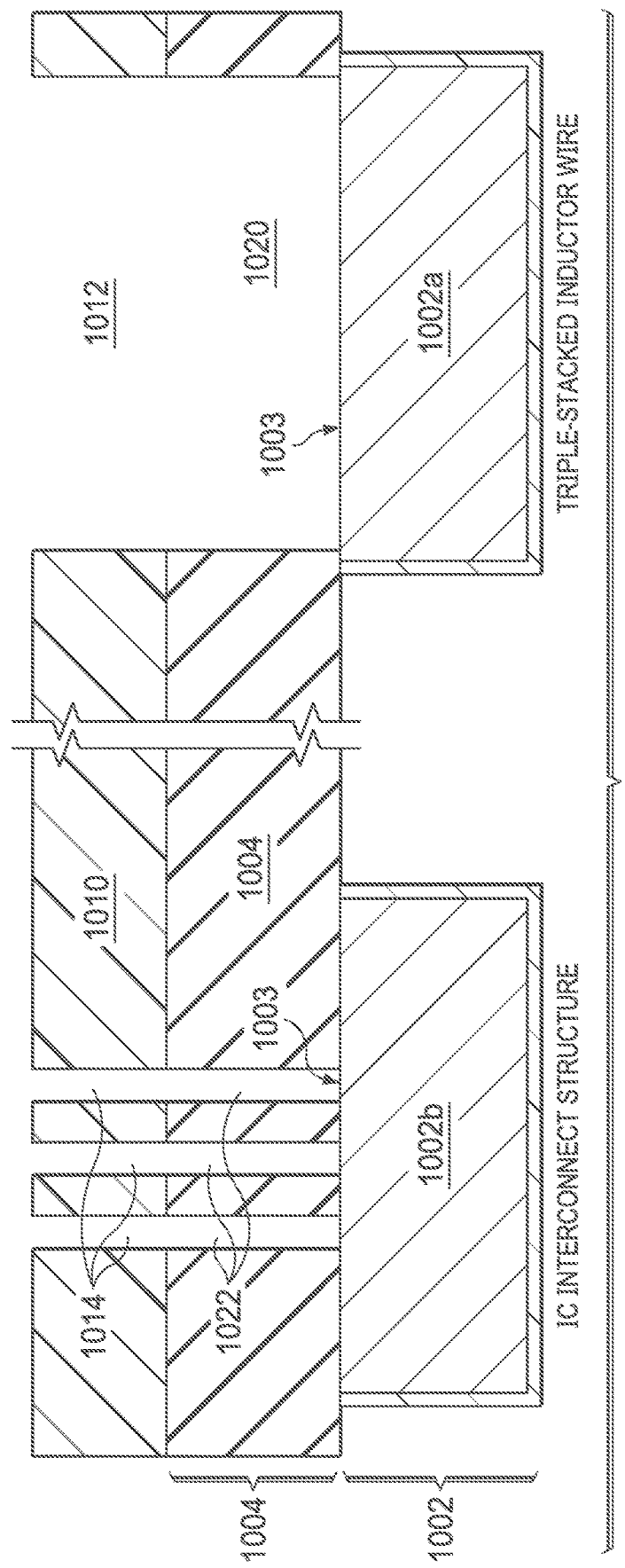
Figure 10C:
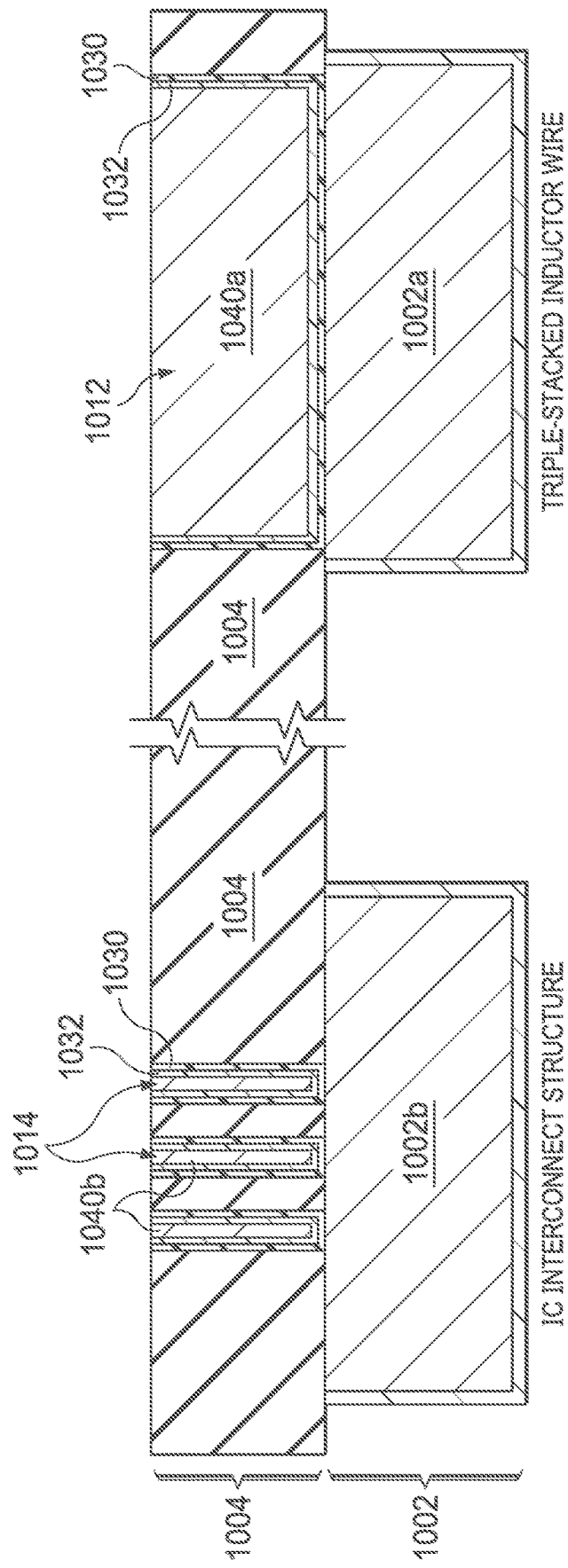
Figure 10D:
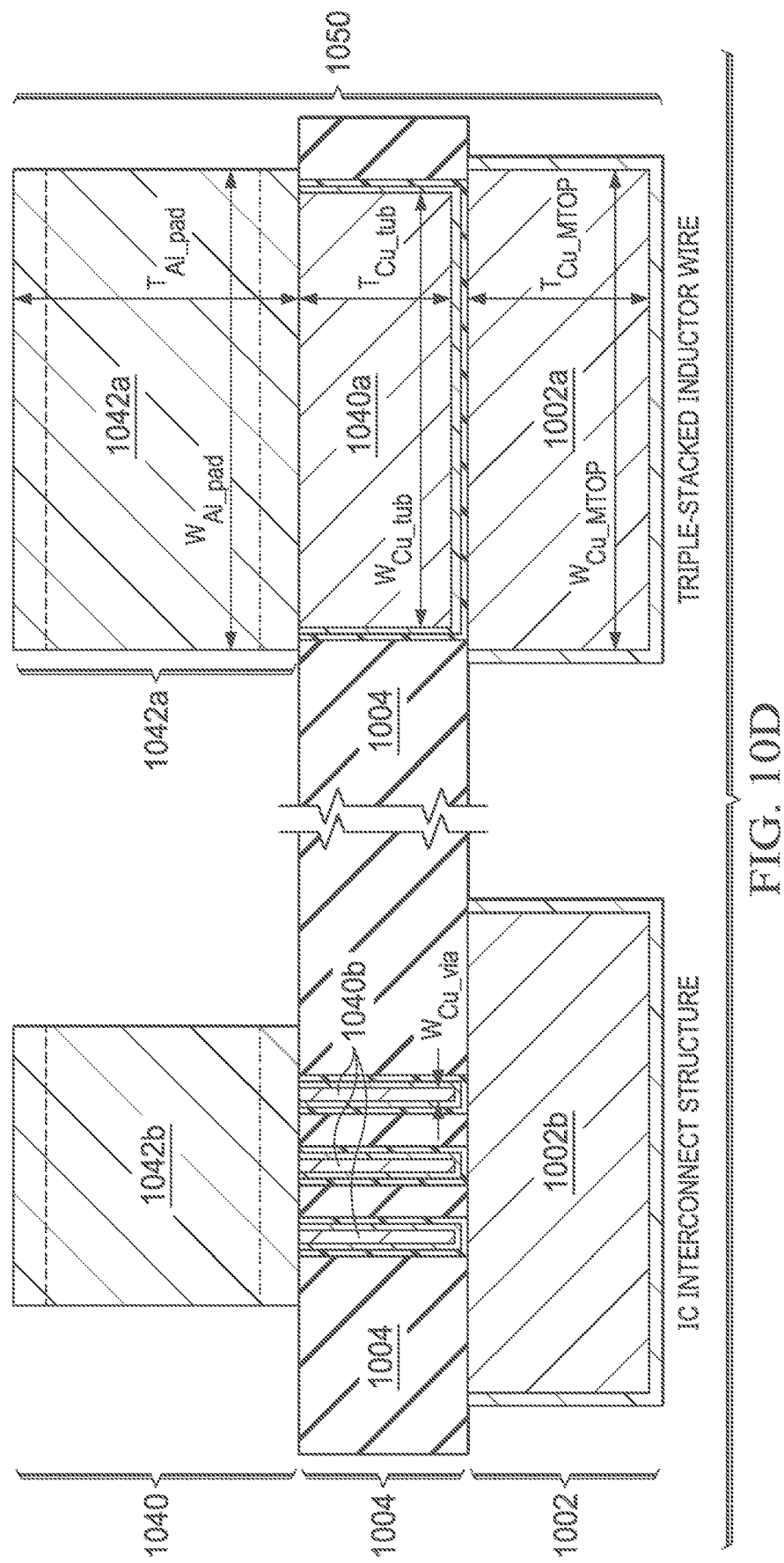

As used herein, the "lateral width" of a respective metal layer of a triple-stacked inductor wire (e.g., the lateral width $W_{tub}$ of Cu tub region 614 shown in FIG. 6, and the lateral widths $W_{Cu\_MTOP}$, $W_{Cu\_tub}$, and $W_{Al\_pad}$ of Cu MTOP region 1002a, Cu tub region 1040a, and Al pad region 1042a shown in FIG. 10D) refers to the horizontal width of the respective metal layer in a direction perpendicular to the major elongated direction of the triple-stacked inductor wire.

As noted above, in embodiments of the present invention the conventional single damascene tungsten (W) via may be replaced by single damascene copper via. A rationale of this replacement is that Cu can fill via and tub openings simultaneously, whereas tungsten generally cannot. In particular, tungsten deposition is typically not suitable for larger openings, e.g., due to inherent stress-related characteristics of tungsten. As a conformal tungsten layer reaches a particular thickness, e.g., in the range of 0.5-0.7 μm, it begins to separate or peel from the underlying barrier layer (e.g., TiN layer). In addition, as the tungsten thickness increases, it can create excessive stresses in the semiconductor wafer itself, and may result in wafer breakage in a subsequent process, such as a typical tungsten Chemical-Mechanical Polishing (CMP) process. Thus, in practice, tungsten deposition is typically limited to openings having a width or diameter of less than about 1.0 μm, depending on the particular application.

Figure 7A:
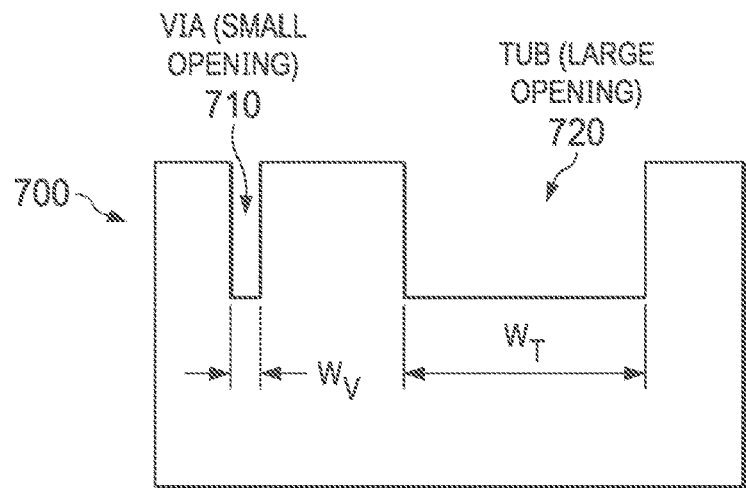
FIGS. 7A-7C provide a series of cross-sectional views of an example semiconductor device structure illustrating the unsuitability of tungsten for a device having both wide and narrow openings.
Figure 7B:
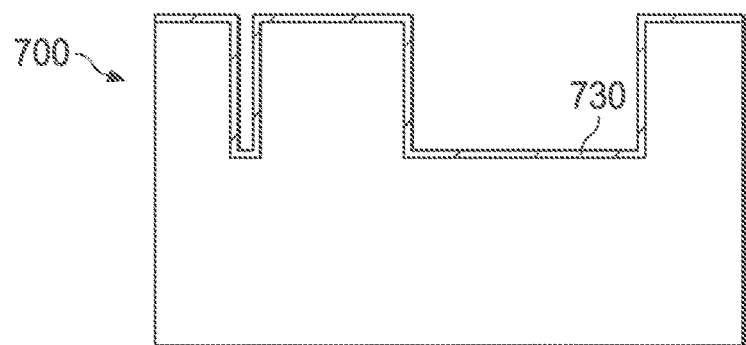
Figure 7C:
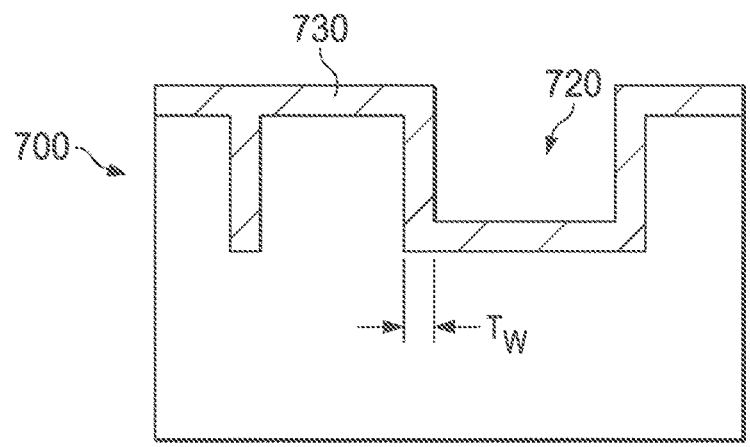

FIGS. 7A-7C provide a series of cross-sectional views of an example semiconductor device structure 700 illustrating the unsuitability of tungsten for a device having both wide and narrow openings, for example for a device including both (a) IC structures with via connections between Al bond pads and Cu interconnect and (b) a thick-wire integrated inductor utilizing a wide conductive region (e.g., "tub" region) between the Al bond pad layer and Cu MTOP layer. As shown in FIG. 7A, semiconductor device structure 700 includes a narrow via opening 710 (e.g., lateral width $W_V$=0.3 μm) and a wide opening or "tub opening" 720 (e.g., lateral width $W_T$=3 μm). A TiN barrier layer (not shown) may be formed over the structure and extending into openings 710 and 720, to thereby coat the exposed surfaces of via and tub openings 710 and 720 to improve tungsten adhesion to the substrate. Then, as shown in FIG. 7B, a tungsten deposition process (e.g., CVD) may be started, which forms a conformal tungsten layer 730. As shown in FIG. 7C, the thickness $T_W$ of the conformal tungsten layer 730 increases as the tungsten deposition continues. Once the tungsten layer 730 reaches a particular thickness, e.g., $T_W$=0.7 μm, the tungsten layer 730 in the tub opening 720 may peel or separate from the underlying TiN barrier and/or begin to experience or cause stress-related failures. Thus, the tungsten deposition is unable to effectively fill the tub opening 720.

The inventors have conceived of concurrently forming both (a) a wide metal region defining a middle layer of a triple-stacked wire of an integrated inductor and (b) narrow vias of other IC structures by using copper or other suitable metal (e.g., nickel or cobalt) to concurrently fill both wide and narrows openings in a bottom-up manner, rather than a conformal manner as with tungsten.

Figure 8A:
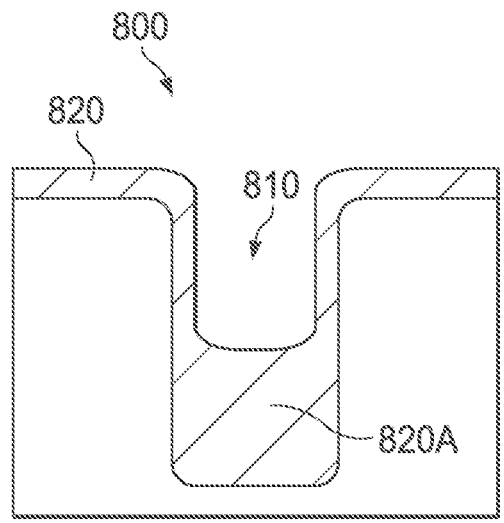
FIGS. 8A and 8B are cross-sectional views of an example semiconductor device structure showing an example of a copper plating super-fill of a wide "tub" opening, e.g., for forming the middle layer of a triple-stacked inductor wire according to some embodiments of the invention.
Figure 8B:
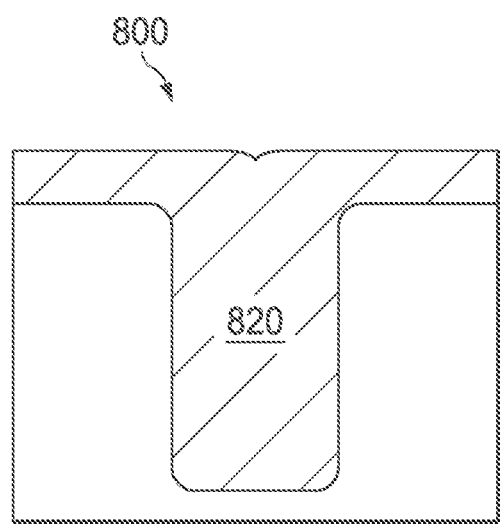

FIGS. 8A and 8B are cross-section views of an example semiconductor device structure 800 showing an example of a copper fill of a wide "tub" opening 810. Tub opening 810 may have a lateral width or diameter greater than 1 μm, for example in the range of 2-10 μm. As shown in FIG. 8A, as copper 820 is deposited, the copper 820 may build up at the bottom of the tub opening 810, as indicated at 820a. This bottom-up fill may continue until tub opening 810 is completely filled with copper 820, as shown in FIG. 8B. The bottom-up manner of filling tub opening 810 may avoid the problems discussed above associated with tungsten deposition.

In some embodiment, the bottom-up filling is achieved by adding organic additives into the electrochemical copper plating solution to suppress the plating rate on the surface of the wafer, while enhancing the plating rate within the openings. In some embodiments, the bottom-up copper fill may be further improved by the use of accelerators, suppressors, and/or levelers, in the copper electrochemical plating solution or plating bath.

Figure 9A:
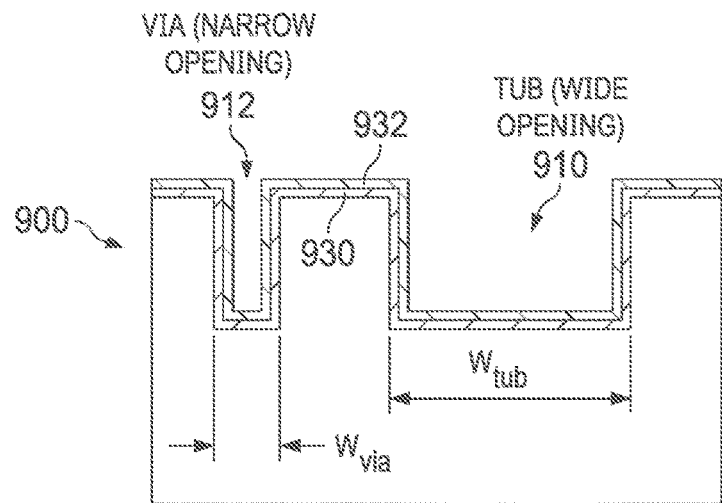
FIGS. 9A-9C provide a series of cross-sectional views illustrating the use of an electrochemical copper plating process as shown in FIG. 8A-8B to fill both wide openings and narrow openings in an example IC device structure.
Figure 9B:
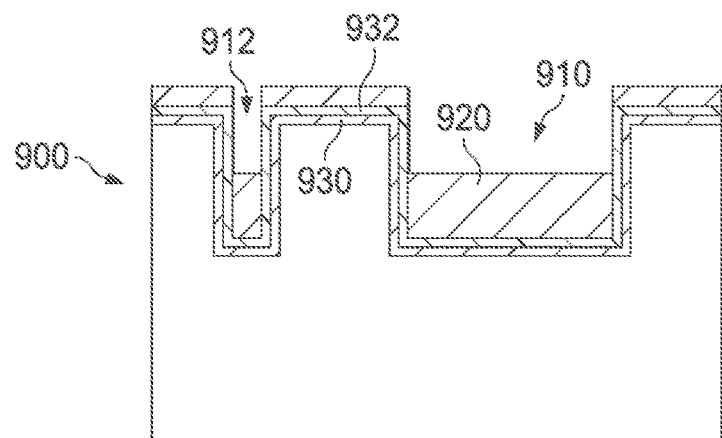
Figure 9C:
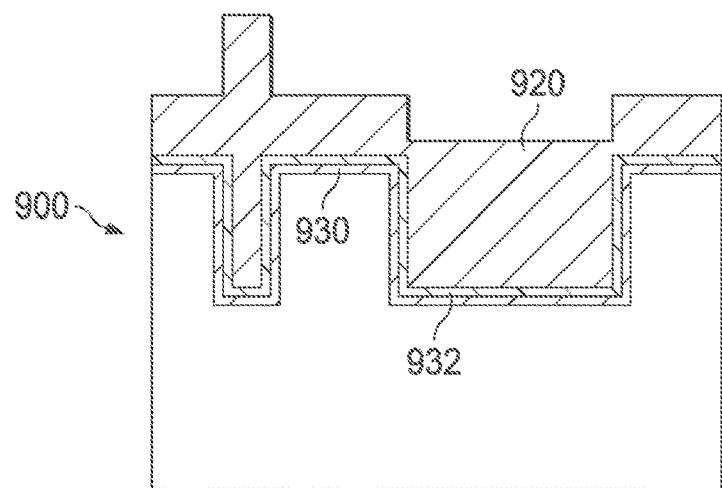

FIGS. 9A-9C provide a series of cross-sectional views illustrating the use of a electrochemical copper plating process as shown in FIG. 8A-8B to fill both wide openings and narrow openings in an example IC device structure 900, for example to concurrently form both (a) a wide Cu middle layer of a triple-stacked wire of an integrated inductor and (b) narrow Cu vias for other IC interconnect structures, according to the present invention. FIGS. 9A-9C generally contrast with FIGS. 7A-7C discussed above, which show the unsuitability of tungsten for filling such openings. As shown in FIG. 9A, the example IC structure 900 includes a wide opening or "tub opening" 910 (e.g., lateral width $W_{tub} > 1$ μm) and a narrow via opening 912 (e.g., lateral width $W_{via} < 1$ μm). In some embodiments, a barrier layer 930, followed by a thin seed layer 932, may be formed over the semiconductor device structure 900 and extending into openings 910 and 912, to thereby coat the exposed surfaces of openings 910 and 912. Barrier layer 930 may comprise a Ta/TaN bi-layer, Ti/TiN bi-layer or other suitable material (s), and seed layer 932 may comprise copper or other suitable material(s).

Then, as shown in FIG. 9B, a copper deposition process, in an exemplary embodiment, an electrochemical copper plating, may be started, which begins to fill each opening 910 and 912 with copper 920 in a bottom-up manner. As can be seen, due to the nature of bottom-up fill, the smaller geometry of the narrow via opening 912 fills up faster than the wider tub opening 910. FIG. 9C shows the tub opening 910 and via opening 912 after being completely filled with copper 920. Thus, unlike tungsten, copper is suitable for concurrently filling both narrow and wide openings, e.g., for constructing a middle layer of a triple-stacked wire of an integrated inductor according to the present invention.

The concept of using a Cu fill for simultaneously filling via and tub openings is disclosed in detail in co-pending U.S. patent application Ser. No. 16/999,358 filed Aug. 21, 2020, the entire contents of which are hereby incorporated by reference.

FIGS. 10A-10D illustrate an example process for forming an integrated inductor including a triple-stacked inductor wire in an IC device including various other IC interconnect structures, according to one embodiment of the invention. Each FIG. 10A-10C shows cross-sectional views at two locations of the IC device under construction, namely (a) a first location (labelled "Triple-Stacked Inductor Wire") at which an integrated inductor is formed and (b) a second location (labelled "IC Interconnect Structure") at which an Al bond pad is formed to provide contact to a separate IC structure via copper vias. The separate IC interconnect structure may be utilized for interconnect to a transistor, resistor, capacitor, or any other type of electronic component.

First, as shown in FIG. 10A, a Cu top interconnect layer (Cu MTOP layer) 1002 is formed, including forming (a) a first Cu MTOP region 1002a that forms a lower layer of a triple-stacked wire of the integrated inductor being constructed, (b) a second Cu MTOP region 1002b comprising an element of (or contact to) one or more transistor, resistor, capacitor, or any other type of electronic component(s), and (c) any other interconnect elements of the example IC device. In one embodiment, the Cu MTOP layer 1002 may be formed by a damascene Cu deposition, followed by a Cu chemical mechanical planarization (CMP) to planarize the top surface.

An insulating region 1004 may be deposited over the Cu MTOP layer 1002. In the embodiment discussed below, the insulating region 1004 comprises a passivation region, which may comprise a combination of multiple layers of dielectric films configured to protect underlying active integrated circuit components. For example, the passivation region 1004 may include the following four layers, preferably deposited in the following order: (1) 0.1 μm Silicon Nitride, (2) 0.1 μm Silicon Rich Oxide (SRO), (3) 0.68 μm Phosphorus Silicate Glass (PSG), and (4) 0.59 μm Silicon oxynitride (SiON). In other embodiments, e.g., where the integrated inductor is formed further down in the IC device structure (e.g., below the top interconnect layer), the insulating region 1004 may comprise any other electrically insulating region, e.g., an oxide region or nitride layer, formed in the IC device structure.

Next, with reference to FIG. 10B, a photoresist layer 1010 is deposited over passivation layer 1004 and patterned to form a wide opening 1012 aligned over the first Cu MTOP region 1002a and multiple narrow openings 1014 aligned over the second Cu MTOP region 1002b. A via etch may then be performed through openings 1012, 1014 in the photoresist 1010 to define a wide tub opening 1020 and multiple narrow via openings 1022 in passivation layer 1004. Each etched opening 1020, 1022 may expose an area of the top surface 1003 of the Cu MTOP layer 1002. After the etch, remaining portions of photoresist 1010 may be removed by a resist strip or other suitable removal process.

As shown in FIG. 10C, after removing the photoresist 1010, the wide tub opening 1020 and narrow via openings 1022 may be filled with copper, e.g., using a single damascene copper via process, which may include (a) depositing a barrier layer followed by a copper seed layer, (b) performing a copper electrochemical plating, (c) performing a copper anneal, and (d) performing a copper CMP, as discussed below.

In one embodiment, a barrier layer 1030 and a seed layer 1032 are first deposited into openings 1020 and 1022. The barrier layer 1030 may comprise a Ta/TaN bi-layer, Ti/TiN bi-layer or any other suitable barrier layer, and may have a thickness in the range of 100-400 Å. Seed layer 1032 may comprise copper or other suitable seed layer material, and may have a thickness in the range of 600-1200 Å.

A bottom-up copper fill process, e.g., a copper electrochemical plating process as described above with respect to FIGS. 8A-8B and FIGS. 9A-9C, is then performed to concurrently form (a) a Cu tub region 1040a that defines the middle layer of the triple-stacked wire of the integrated inductor being constructed and (b) multiple Cu vias 1040b. In some embodiments, additives (e.g., accelerators, suppressors, and/or levelers) may be added in the plating solution to enhance the bottom-up copper fill.

In some embodiments, the deposited copper structures 1040a, 1040b may be annealed, for example by heating in a furnace for 30-105 minutes at a temperature of 200° C. A copper CMP (chemical mechanical planarization) may then be performed to planarize the copper structures 1040a, 1040b down to the top surface of the passivation region 1004 (or further down, thus removing a partial thickness of the passivation region 1004), thereby removing upper portions of the deposited copper structures 1040a, 1040b. The resulting structure after the CMP is shown in FIG. 10C.

Finally, as shown in FIG. 10D, an aluminum layer 1040 may be formed on top of the structure. The aluminum layer 1040 may comprise a single aluminum layer or a stack of multiple sub-layers deposited over the structure, as indicated by the horizontal dashed lines extending through Al layer 1040. In one embodiment, Al layer 1040 comprises a three-layer stack including an aluminum sub-layer sandwiched between a pair of Ti/TiN sub-layers. In another embodiment, Al layer 1040 may comprise an aluminum sub-layer formed over a TaN/Ta sub-layer. In each of these embodiments, the Ti/TiN and/or TaN/Ta sub-layer underneath the aluminum sub-layer may act as a copper diffusion barrier.

The deposited Al layer 1040 may then be patterned and etched to define (a) an Al pad region 1042a over the Cu tub region 1040a, which defines an upper layer of the triple-stacked inductor wire of the integrated inductor being constructed and (b) an Al bond bad 1042b on the Cu vias 1040b, which provide conductive contact to the Cu MTOP region 1002b of the separate IC interconnect structure. As shown in FIG. 10D, the Al layer 1042a, Cu tub region 1040a, and underlying Cu MTOP region 1002a define the triple-stacked inductor wire 1050.

In some embodiments, a lateral width of the Cu tub 1040a, $W_{Cu\_tub}$, is greater than 1 µm, e.g., in the range of 1-10 µm, and a lateral width of each Cu via 1040b, $W_{Cu\_via}$, is less than 1 µm. In some embodiment, $W_{Cu\_tub}$ is greater than 2 µm (e.g., in the range of 2-10 µm), and $W_{Cu\_via}$ of each copper via is less than 1 µm, e.g., less than 0.5 µm. In some embodiments, $W_{Cu\_tub}$ is in the range of 1-5 µm, e.g., in the range of 2-3 µm, and $W_{Cu\_via}$ is less than 1 µm, e.g., less than 0.5 µm.

In some embodiments, a lateral width of the Cu MTOP region 1002a, $W_{Cu\_MTOP}$, is greater than 1 µm, e.g., in the range of 1-10 µm or 1-5 µm, and similarly a lateral width of the Al pad region 1042a, $W_{Al\_pad}$, may be greater than 1 µm, e.g., in the range of 1-10 µm or 1-5 µm.

In some embodiments, the lateral widths $W_{Cu\_MTOP}$, $W_{Cu\_tub}$, and $W_{Al\_pad}$ of Cu MTOP region 1002a, Cu tub region 1040a, and Al pad region 1042a may be the same, to thereby provide a uniform-width inductor wire. In some embodiments, the lateral widths $W_{Cu\_MTOP}$, $W_{Cu\_tub}$, and $W_{Al\_pad}$ of Cu MTOP region 1002a, Cu tub region 1040a, and Al pad region 1042a may be the nearly the same, e.g., with the largest layer width (of the three metal layers) varying from the narrowest layer width by less than 200%, less than 100%, less than 75%, less than 50%, less than 25%, or less than 10%. Increasing the uniformity of width for $W_{Cu\_MTOP}$, $W_{Cu\_tub}$, and $W_{Al\_pad}$ may improve the performance of the integrated inductor.

As noted above, in some embodiments, the triple-stacked inductor wire 1050 has very low resistance, e.g., less than 5 mΩ/sq, less than 4 mΩ/sq, or less than 3 mΩ/sq. For example, in one example embodiment, (a) the Cu MTOP region 1002a has a vertical thickness (height) $T_{Cu\_MTOP}$ of 2 µm and resistance of about 10 mΩ/sq, (b) the Cu tub region 1040a has a vertical thickness (height) $T_{Cu\_tub}$ of 2 µm and resistance of about 10 mΩ/sq, and (c) the Al pad region 1042a has a vertical thickness (height) $T_{Al\_pad}$ of 4 µm and resistance of about 8 mΩ/sq, which provides a very low resistance of about 3 mΩ/sq for the triple-stacked inductor wire 1050. In some embodiments, the triple-stacked inductor wire 1050 formed as described above may add little or no additional process steps to the background IC fabrication process flow, and may thus adds little or no additional process cost.

The invention claimed is:

1. A method of forming an integrated inductor in an integrated circuit (IC) device, the method comprising:
   forming a lower metal layer of the integrated inductor;
   forming an insulating region over the lower metal layer of the integrated inductor;
   etching a tub opening and at least one via opening in the insulating region, the tub opening having a lateral width greater than 1 µm, and wherein the at least one via opening is separate from the integrated inductor;
   depositing metal into (a) the tub opening to define a middle metal layer of the integrated inductor on the lower metal layer of the integrated inductor and (b) the at least one via opening to form at least one metal via separate from the integrated inductor; and
   forming an upper metal layer of the integrated inductor on the middle metal layer of the integrated inductor;
   wherein the inductor wire includes an overlap region in which an overcrossing section of the upper metal layer, configured to carry current in a first direction, crosses over an undercrossing section of the lower metal layer, configured to carry current in a second direction different than the first direction, wherein the overcrossing section of the upper metal layer is physically separated and electrically insulated from the undercrossing section of the lower metal layer by a gap in the middle metal layer.

2. The method of claim 1, wherein:
   the lower metal layer of the integrated inductor comprises copper;
   the middle metal layer of the integrated inductor comprises copper; and
   the upper metal layer of the integrated inductor comprises aluminum.

3. The method of claim 1, wherein:
   forming the lower metal layer of the integrated inductor comprises forming a top copper interconnect layer;
   forming the insulating region over the lower metal layer of the integrated inductor comprises forming a passivation region; and
   forming the upper metal layer of the integrated inductor comprises forming an aluminum bond pad layer.

4. The method of claim 1, comprising etching the tub opening concurrently with etching the at least one via opening, wherein respective via openings have a respective lateral width less than 1 µm.

5. The method of claim 1, wherein depositing metal extending into the tub opening and into the at least one via opening comprises depositing copper in the tub opening concurrently with depositing copper in the at least one via opening separate from the integrated inductor.

6. The method of claim 1, wherein depositing metal into the tub opening and the at least one via opening comprises performing a copper electrochemical plating.

7. The method of claim 1, comprising:
   forming the lower metal layer of the integrated inductor with a lateral width greater than 1 µm;
   depositing the metal into the tub opening to define the middle metal layer of the integrated inductor with a lateral width greater than 1 µm; and
   forming the upper metal layer of the integrated inductor with a lateral width greater than 1 µm.

8. The method of claim 1, comprising:
   forming the middle metal layer of the integrated inductor with a lateral width greater than 2 µm; and
   forming the at least one metal via with lateral width or diameter of each respective metal via of less than 0.5 µm.

9. The method of claim 1, comprising forming the lower metal layer of the integrated inductor with a spiral shape.

10. The method of claim 1, comprising forming the upper metal layer, the middle metal layer, and the lower metal layer of the integrated inductor in a stacked manner to define a stacked inductor wire extending in an elongated direction, wherein in a respective cross-section of the stacked inductor wire perpendicular to the elongated direction, a lateral width of the upper metal lateral width, a lateral width of middle metal lateral width, and a lateral width of lower metal lateral width vary from each other by less than 100%.

11. The method of claim 1, comprising forming the upper metal layer, the middle metal layer, and the lower metal layer of the integrated inductor in a stacked manner to define a stacked inductor wire extending in an elongated direction, wherein in a respective cross-section of the stacked inductor wire perpendicular to the elongated direction, a lateral width of the upper metal lateral width, a lateral width of middle metal lateral width, and a lateral width of lower metal lateral width vary from each other by less than 25%.

12. The method of claim 1, comprising:
forming a lower interconnect structure concurrently with the lower metal layer of the integrated inductor; and
forming an upper interconnect structure concurrently with the upper metal layer of the integrated inductor;
wherein the at least one metal via are connected between the lower interconnect structure and the upper interconnect structure.

13. The method of claim 12, wherein the upper interconnect structure comprises a bond pad.

14. A method of forming an integrated inductor in an integrated circuit (IC) device, the method comprising:
forming a first layer including (a) a lower metal inductor structure and (b) a lower metal interconnect structure;
forming a second layer including (a) a middle metal inductor structure and (b) a middle metal interconnect structure;
forming a third metal layer including (a) an upper metal inductor structure and (b) an upper metal interconnect structure;
wherein the lower metal inductor structure, the middle metal inductor structure, and the upper metal inductor structure collectively define a multi-layer inductor wire of the integrated inductor; and
wherein the lower metal interconnect structure, the middle metal interconnect structure, and the upper metal interconnect structure collectively define a multi-layer interconnect structure physically distinct from the multi-layer inductor wire;
wherein the multi-layer inductor wire of the elongated inductor wire includes an overlap region in which an overcrossing section of the upper metal inductor structure, configured to carry current in a first direction, crosses over an undercrossing section of the lower metal inductor structure, configured to carry current in a second direction different than the first direction, wherein the overcrossing section of the upper metal inductor structure is physically separated and electrically insulated from the undercrossing section of the lower metal inductor structure by a gap in the middle metal inductor structure.

15. The method of claim 14, comprising:
forming the lower metal inductor structure and the lower metal interconnect structure concurrently;
forming the middle metal inductor structure and the middle metal interconnect structure concurrently;
forming the upper metal inductor structure and the upper metal interconnect structure concurrently.

16. The method of claim 14, wherein the middle metal interconnect structure comprises at least one via connecting the upper metal interconnect structure with the lower metal interconnect structure.

17. A method of forming an integrated circuit (IC) device, comprising:
forming an elongated inductor wire by a process including:
forming a continuous lower metal layer structure;
forming a discontinuous middle metal layer structure over the continuous lower metal layer structure, the discontinuous middle metal layer structure including first and second physical sections of the discontinuous middle metal layer structure separated by a middle metal layer structure gap; and
forming a continuous upper metal structure over the discontinuous middle metal layer structure;
wherein the middle metal layer structure gap is located at an overlap region of the elongated inductor wire in which an overcrossing section of the continuous upper metal layer structure, configured to carry current in a first direction, crosses over an undercrossing section of the continuous lower metal layer structure, configured to carry current in a second direction different than the first direction, and wherein the overcrossing section of the continuous upper metal layer structure is physically separated and electrically insulated from the undercrossing section of the continuous lower metal layer structure by the middle metal layer structure gap.

18. The method of claim 17, wherein:
a portion of the elongated inductor wire including the first physical section of the discontinuous middle metal layer structure sandwiched between the continuous lower metal layer structure and the continuous upper metal layer structure defines a metal layer stack allowing the continuous lower metal layer structure, the first physical section of the discontinuous middle metal layer structure, and the continuous upper metal layer structure to carry current in the same direction.

19. The method of claim 17, comprising forming the discontinuous middle metal layer structure in a dielectric layer, wherein the middle metal layer structure gap comprises a region of the dielectric layer.

20. The method of claim 17, comprising forming at least one metal via separate from the elongated inductor wire concurrently with the discontinuous middle metal layer structure.

* * * * *